United States Patent
Forbes

[19]

[11] Patent Number: 6,141,256
[45] Date of Patent: Oct. 31, 2000

[54] DIFFERENTIAL FLASH MEMORY CELL AND METHOD FOR PROGRAMMING SAME

[75] Inventor: Leonard Forbes, Corvallis, Oreg.

[73] Assignee: Micron Technology, Inc., Boise, Id.

[21] Appl. No.: 09/470,079

[22] Filed: Dec. 22, 1999

Related U.S. Application Data

[63] Continuation of application No. 09/031,616, Feb. 27, 1998, Pat. No. 6,009,018, which is a continuation of application No. 08/790,902, Jan. 29, 1997, Pat. No. 5,754,477.

[51] Int. Cl.[7] .................................................. G11C 7/00
[52] U.S. Cl. ..................... 365/185.33; 365/202; 365/207
[58] Field of Search ........................ 365/185.01, 230.01, 365/185.33, 202, 207

[56] References Cited

U.S. PATENT DOCUMENTS

| | | | |
|---|---|---|---|
| 5,021,999 | 6/1991 | Kohda et al. | 365/168 |
| 5,027,171 | 6/1991 | Reedy et al. | 357/23.5 |
| 5,111,430 | 5/1992 | Morie | 365/185 |
| 5,253,196 | 10/1993 | Shimabukuro | 365/45 |
| 5,293,560 | 3/1994 | Harari | 365/185 |
| 5,317,535 | 5/1994 | Talreja et al. | 365/185 |
| 5,357,134 | 10/1994 | Shimoji | 257/325 |
| 5,388,069 | 2/1995 | Kokubo | 365/185 |
| 5,418,743 | 5/1995 | Tomioka et al. | 365/189.01 |
| 5,424,993 | 6/1995 | Lee et al. | 365/218 |
| 5,430,670 | 7/1995 | Rosenthal | 365/45 |
| 5,434,815 | 7/1995 | Smarandoiu et al. | 365/189.01 |
| 5,438,544 | 8/1995 | Makino | 365/185 |
| 5,467,306 | 11/1995 | Kaya et al. | 365/185.2 |
| 5,477,485 | 12/1995 | Bergemont et al. | 365/185.24 |
| 5,485,422 | 1/1996 | Bauer et al. | 365/168 |
| 5,627,781 | 5/1997 | Hayashi et al. | 365/185.2 |
| 5,714,766 | 2/1998 | Chen et al. | 257/20 |
| 5,754,477 | 5/1998 | Forbes | 365/185.33 |
| 6,009,018 | 12/1999 | Forbes | 365/185.33 |

FOREIGN PATENT DOCUMENTS

| | | | |
|---|---|---|---|
| 0139185 | 5/1985 | European Pat. Off. | G11C 17/00 |
| 0448118 | 9/1991 | European Pat. Off. | G11C 16/04 |
| 0750353 | 12/1996 | European Pat. Off. | H01L 29/86 |

OTHER PUBLICATIONS

Alok, D., et al., "Electrical Properties of Thermal Oxide Grown on N–type 6H–Silicon Carbide", *Applied Physics Letters*, 64, 2845–2846, (May 23, 1994).

Baldwin, G.L., et al., "The Electronic Conduction Mechanism of Hydrogenated Nanocrystalline Silicon Films", *Proc. 4th Int. Conf. on Solid–State and Int. Circuit Tech, Beijing*, 66–68, (1995).

Bauer, M., et al., "A Multilevel–Cell 32 Mb Flash Memory", *Digest IEEE, Solid–State Circuits Conf.*, 440, (1995).

Boeringer, D.W., et al., "Avalanche amplification of multiple resonant tunneling through parallel silicon microcrystallites", *Physical Rev. B*, 51, 13337–13343, (1995).

Demichelis, F., et al., "Influence of Doping on the Structural and Optoelectronic Properties of Amorphous and Microcrystalline Silicon Carbide", *Journal of Applied Physics*, 72, 1327–1333, (Aug. 15, 1992).

Demichelis, F., et al., "Physical Properties of Undoped and Doped Microcrystalline SiC:H Deposited by PECVD", *Materials Research Society Symposium Proceedings*, 219, Anaheim, CA, 413–418, (Apr. 30, –May 3, 1991).

(List continued on next page.)

*Primary Examiner*—Terrell W. Fears
*Attorney, Agent, or Firm*—Schwegman, Lundberg, Woessner & Kluth, P.A.

[57] ABSTRACT

A flash memory cell. The flash memory cell includes first and second transistors. The first transistor has a control gate coupled to a word line, a drain coupled to a data line and a floating gate. The second transistor, similarly, includes a control gate coupled to the word line, a drain coupled to a second data line and a second floating gate. The first floating gate stores a state of the second transistor prior to programming of the flash memory cell. Further, the second floating gate stores a programmed state of the second transistor. A difference between the states of the first and second transistors represents the value of the data stored in the flash memory cell.

35 Claims, 3 Drawing Sheets

OTHER PUBLICATIONS

Dipert, B., et al., "Flash Memory Goes Mainstream", *IEEE Spectrum*, 30, 48–52, (1993).

Edelberg, E., et al., "Visible Luminescence from Nanocrystalline silicon films produced by plasma enhanced chemical vapor deposition", *Appl. Phys. Lett.*, 68, 1415–1417, (1996).

Hamakawa, Y., et al., "Optoelectronics and Photovoltaic Applications of Microcrystalline SiC", *Materials Research Society Symposium Proceedings*, 164, Boston, MA, 291–301 (Nov. 29,1–Dec. 1, 1989).

Hu, G. et al., "Will Flash Memory Replace Hard Disk Drive?", *1994 IEEE International Electron Device Meeting*, Panel Discussion, Session 24, Outline, 1 p., (Dec. 13, 1994).

Hybertsen, M.S., "Absorption and Emission of Light in Nanoscale Silicon Structures", *Phys. Rev. Lett.*, 72, 1514–1517, (1994).

Jung, T.S., et al., "A 3.3V, 128Mb Multi–Level NAND Flash Memory for Mass Storage Applications", *1996 IEEE Solid–State Circuits Conf.*, Digest of Technical Papers, 512, (1996).

Kamata, T., et al., "Substrate Current Due to Impact Ionization in MOS–FET", *Japan. J. Appl. Phys.*, 15, 1127–1134, (Jun. 1976).

Kato, M., et al., "Read–Disturb Degradation Mechanism due to Electron Trapping in the Tunnel Oxide for Low–voltage Flash Memories", *IEEE Electron Device Meeting*, 45–48, (1994).

Ohkawa, M., et al., "A 98 mm 3.3V 64Mb Flash Memory with FN–NOR type 4–Level Cell", *IEEE International Solid–State Circuits Conference*, 36–37, (1996).

Prendergast, J., "Flash or DRAM: Memory Choice for the Future", *IEEE Electron Device Meeting, Session 25*, Phoenix, AZ, (1995).

Schoenfeld, O., et al., "Formation of Si Quantum dots in Nanocrystalline silicon", *Proc. 7th Int. Conf. on Modulated Semiconductor Structures, Madrid*, 605–608, (1995).

Shimabukuro, R.L., et al., "Circuitry for Artifical Neural Networks with Non–volatile Analog Memories", *IEEE Int'l Symp. on Circuits and Systems*, 2, 1217–1220, (1989).

Shimabukuro, R.L., et al., "Dual–Polarity Nonvolatile MOS Analogue Memory (MAM) Cell for Neural–Type Circuitry", *Electronics Lett.*, 24, 1231–1232, (Sep. 15, 1988).

Suh, K.D., et al., "A 3.3 V 32 Mb NAND Falsh Memory with Incremental Step Pulse Programming Scheme", *IEEE J. Solid–State Circuits*, 30, 1149–1156, (Nov. 1995).

Sze, S. M., "Physics of Semiconductor Devices", *Wiley–Interscience 2d Ed.*, New York, 482, (1981).

Takeuchi, K., et al., "A Double–Level–V Select Gate Array Architecture for Mulitilevel NANAD Flash Memories", *IEEE Journal of Solid–State Circuits*, 31, 602–609, (Apr. 1996).

Tiwari, S., et al., "A silicon nanocrystal based memroy", *Appl. Physics Lett.*, 68, 1377–1379, (1996).

Tiwari, S., et al., "Volatile and Non–Volatile Memories in Silicon with Nano–Crystal Storage", *Int'l Electron Devices Meeting: Technical Digest*, Washington, DC, 521–524, (Dec. 1995).

Tsu, R., et al., "Slow Conductance oscillations in nanoscale silicon clusters of quantum dots", *Appl. Phys. Lett.*, 65, 842–844, (1994).

Tsu, R., et al., "Tunneling in Nanoscale Silicon Particles Embedded in an $SiO_2$ Matrix", *Abstract, IEEE Device Research Conference*, 178–179, (1996).

Ye, Q., et al., "Resonant Tunneling via Microcrystalline–silicon quantum confinement", *Physical Rev. B*, 44, 1806–1811, (1991).

Yih, C.M., et al., "A Consistent Gate and Substrate Current Model for Sub–Micron MOSFET'S by Considering Energy Transport", *Int'l Symp. on VLSI Tech., Systems and Applic.*, Taiwan, 127–130, (1995).

Zhao, X., et al., "Nanocrystalline Si: a material constructed by Si quantum dots", *1st Int. Conf. on Low Dimensional Structures and Devices, Singapore*, 467–471, (1995).

DIFFERENTIAL FLASH MEMORY CELL AND METHOD FOR PROGRAMMING SAME

This application is a continuation of U.S. application Ser. No. 09/031,616, filed Feb. 27, 1998 now U.S. Pat. No. 6,009,018, which is a continuation of U.S. application Ser. No. 08/790,902, filed Jan. 29, 1997, now U.S. Pat. No. 5,754,477.

TECHNICAL FIELD OF THE INVENTION

The present invention relates generally to the field of electronic devices and, in particular, to a differential flash memory cell and method for programming same.

BACKGROUND OF THE INVENTION

Typically, computer systems store data on a magnetic medium such as a hard disk drive. The hard disk drive is an electromechanical component of the computer system that operates by storing polarities on magnetic material which can be rewritten quickly and as often as desired. A typical hard drive includes at least two moving parts that respond to control signals generated by a processor of the computer system. Conventionally, a hard disk drive includes a disk that is formed from an aluminum substrate that is rotatably mounted to a base. A magnetic material is deposited on a surface of the substrate. A rotatable actuator arm moves a ceramic transducer over the surface of the disk to read data from and write data to the hard disk. These mechanical parts are more delicate and less reliable than the other, solid state, components of the computer system. However, magnetic hard disk systems have dominated storage media for computers and related systems due to the low cost and high density storage capacity of available magnetic hard disk systems when compared to conventional solid state alternatives.

Solid state memory devices store data in storage locations, referred to as "cells." Conventional designs only allow a single bit of data to be stored at a given time in each cell. Typically, a cell includes an access transistor and a storage element such as a capacitor or a floating gate that stores data based on the electric charge on the storage element. The electric charge in conventional applications represents either a binary "1" or "0" and thus conventional designs require a single transistor for each bit of data. The storage density for solid state memories is limited by the ability of designers to pack transistors close together on a semiconductor substrate. Although transistors can be packed more tightly together with each succeeding generation of design technology, this density does not compare well with the storage density of a magnetic medium.

Recently, designers have attempted to increase the storage density of flash memory cells by creating a memory cell that is capable of storing more than one data bit—so called "multi-state" flash memory cells. In a conventional flash memory, charge is stored on a floating gate of a field-effect transistor in response to a signal applied to a control gate. The charge on the floating gate represents either a binary "1" or "0" based on the effect the charge has on the current through the transistor. When the floating gate is charged, the drain current is reduced. Initially, the floating gate is not charged, which represents a binary "1." When a binary "0" is stored, electrons are forced to the floating gate by a sufficient voltage on the control gate to induce hot electron injection which reduces the drain current of the transistor. Thus, by sensing the drain current of the transistor, the value of the data bit stored by the flash memory cell can be determined.

To increase the number of states that can be stored, designers have attempted to use adjustments to the threshold voltage of the transistor. Unfortunately, this technique has only been shown to work with, at most, storing two to four bits of data in a single cell due to variations in threshold voltage of each transistor in the array of memory cells. Otherwise, complex programming techniques to adjust the threshold voltage of the transistors during each read and write operation must be used. Thus, current flash memory designs that store multiple states provide only a modest improvement over conventional solid state memories due to difficulties in reading the state stored on the floating gate.

For the reasons stated above, and for other reasons stated below which will become apparent to those skilled in the art upon reading and understanding the present specification, there is a need in the art for a solid state memory device that is capable of effectively storing and retrieving multiple bits of data in each memory cell.

SUMMARY OF THE INVENTION

The above mentioned problems with memory devices and other problems are addressed by the present invention, which will be understood by reading and studying the following specification. A flash memory cell and method for programming the same are described which allow storage of multiple bits per cell.

In particular, an illustrative embodiment of the present invention includes a flash memory cell with first and second transistors. The first transistor has a control gate coupled to a word line, a drain coupled to a data line and a floating gate. The second transistor, similarly, includes a control gate coupled to the word line, a drain coupled to a second data line and a second floating gate. The first floating gate stores a state of the second transistor prior to programming of the flash memory cell. Further, the second floating gate stores a programmed state of the second transistor. A difference between the states of the first and second transistors represents the value of the data stored in the flash memory cell.

In another embodiment, the present invention provides a method for storing multiple bits of data in a flash memory cell. According to the method, storage and reference transistors of the flash memory cell are first balanced. This means that the transistors are forced to have substantially the same conductive state. Next charge is stored on the floating gate of the storage transistor so as to change the drain current of the storage transistor in measurable step changes. The number of step changes in drain current of the storage transistor corresponds to the value of the multiple bits of data to be stored in the flash memory cell.

In another embodiment of the present invention, a flash memory cell includes a reference transistor with a first floating gate and a storage transistor with a second floating gate. The reference and storage transistors are coupled to a common word line. Further, the reference and storage transistors are coupled to different data lines. The flash memory cell provides a differential output signal on the data lines based on charge stored on the first and second floating gates. The differential output signal represents multiple bits of data stored in the flash memory cell.

In another embodiment of the present invention, a flash memory cell includes a reference transistor with a first floating gate and a storage transistor with a second floating gate. The first transistor stores a state of the second transistor prior to programming of the flash memory cell. Thus, a difference between the state of the first transistor and the state of the second transistor after programming represents the value of the data stored in the flash memory cell.

In another embodiment of the present invention, a memory device includes an array of flash memory cells. Each cell includes a reference transistor with a first floating gate and a storage transistor with a second floating gate. The memory device further includes addressing circuitry coupled to the array for accessing a cell of the array. Finally, the memory device includes a sense circuit that is coupled to the array to receive signals from the reference and storage transistors of an accessed memory cell so as to determine multiple bits of data stored in the memory cell based on the difference in drain current of the reference and storage transistors.

DETAILED DESCRIPTION OF THE INVENTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

For purposes of this specification, prepositions, such as "on," "side," (as in "sidewall"), "higher," "lower," "over," and "under" are defined with respect to the conventional planar working surface being on the top surface of the chip or wafer, regardless of the orientation in which the chip is actually held.

Figure 1:
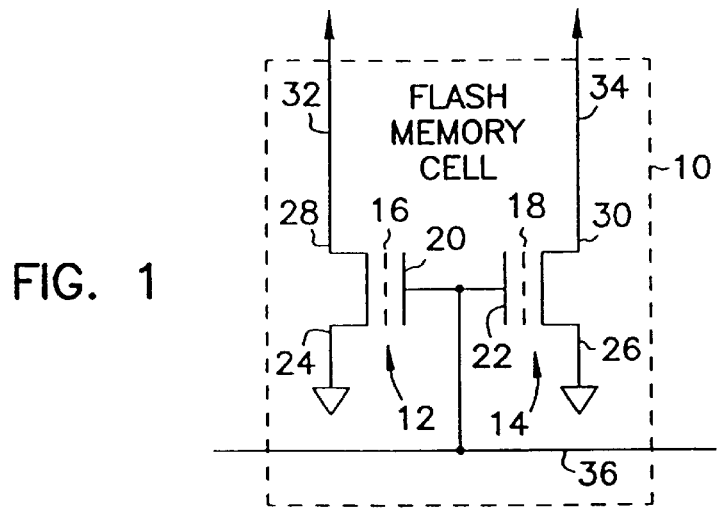
FIG. 1 is a schematic diagram that illustrates an embodiment of a flash memory cell according to the teachings of the present invention.

FIG. 1 is a schematic diagram of an illustrative embodiment of a flash memory cell, indicated generally at 10, that is constructed according to the teachings of the present invention. Memory cell 10 includes first and second field-effect transistors 12 and 14. Transistors 12 and 14 include floating gates 16 and 18, respectively. The term "floating gate" signifies that gates 16 and 18 are electrically isolated in an insulative material, such as a gate oxide. Cell 10 stores data based on the difference in charge on floating gates 16 and 18. Cell 10 is substantially non-volatile (e.g., when power is turned off to cell 10, data stored on floating gates 16 and 18 is not lost) due to a low refresh requirement to maintain charge on floating gates 16 and 18. Further, transistors 12 and 14 include control gates 20 and 22. Control gates 20 and 22 are coupled together and are coupled to word line 36.

In one embodiment, floating gates 16 and 18 are constructed of a number of isolated crystals of conductive material as described below with respect to FIG. 3. Other structures for floating gates 16 and 18 may be substituted for this nano-crystal structure so long as the structure allows charge stored on the floating gates to cause measurable changes in drain current of the transistors, as described below. This includes polycrystalline silicon gates as normally employed in flash memories. Transistors 12 and 14 also include sources 24 and 26 and drains 28 and 30, respectively. Sources 24 and 26 are coupled to ground potential and drains 28 and 30 are coupled to data lines 32 and 34. Data lines 32 and 34 are coupled to a load such as load circuit 37 of FIG. 2A or load circuit 46 of FIG. 2B. Each of these load circuits is described in more detail below with respect to their function in the operation of flash memory cell 10.

In operation, flash memory cell 10 stores data using floating gates 16 and 18 of transistors 12 and 14. To "program" or "write" data to cell 10, transistors 12 and 14 are first "balanced". The term "balanced" means that the transistors are adjusted such that they have substantially the same conductivity state or drain current. Transistors 12 and 14 are balanced by adjusting the charge on floating gates 16 and 18 as described below. Once transistors 12 and 14 are balanced, cell 10 can be programmed by storing charge on floating gate 18, for example, using hot electron injection. In this manner, transistor 12 stores the initial or pre-programming state of transistor 14 (by the balancing operation) and the difference between the state of transistor 12 and the state of programmed transistor 14 establishes the value of data stored in cell 10.

Figures 2A, 2B:
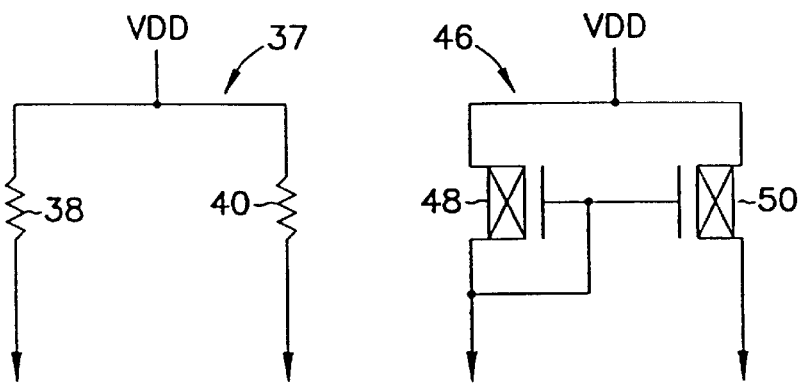
FIGS. 2A and 2B are schematic diagrams of load devices for the flash memory cell of FIG. 1 according to an embodiment of the present invention.
Figure 3:
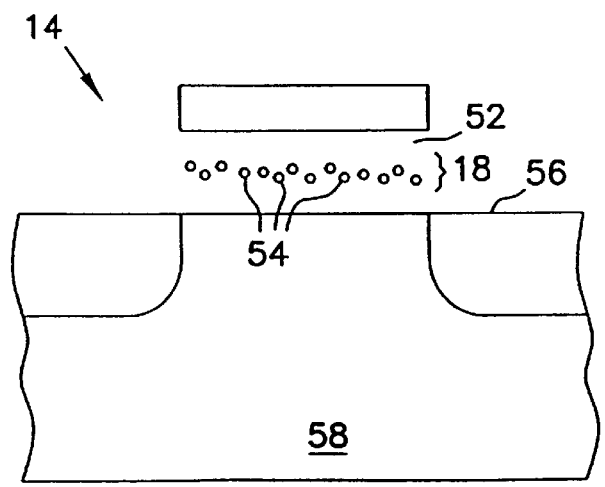
FIG. 3 is a cross sectional view of a transistor with a floating gate comprised of a number of gate elements for use in the flash memory cell of FIG. 1.
Figure 4:
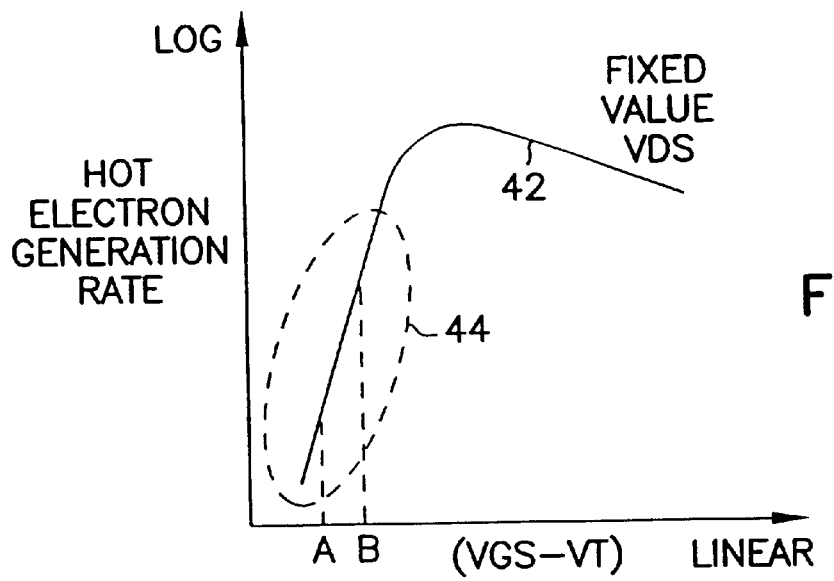
FIG. 4 is a graph that illustrates the relationship between the rate of hot electron injection and voltages applied to a transistor with a floating gate.

To balance transistors 12 and 14, data lines 32 and 34 are coupled to a power supply through small resistors using, for example, load circuit 37 of FIG. 2A. Load circuit 37 includes first and second resistors 38 and 40 and power supply $V_{DD}$. Resistor 38 is coupled between $V_{DD}$ and data line 32. Similarly, resistor 40 is coupled between data line 34 and $V_{DD}$. In this configuration, the voltages of drains 28 and 30 are substantially the same. Due to minor variations between characteristics of transistors 12 and 14, e.g., threshold voltage, one transistor may have a higher drain current than the other transistor. As shown in FIG. 4, the rate of hot electron injection of a transistor with a floating gate is a function of the excess gate-to-source voltage above the threshold voltage, $(V_{GS}-V_T)$, of the transistor as shown by curve 42 of FIG. 4. It is noted that curve 42 is for a fixed drain-to-source voltage. In region 44, curve 42 is substantially linear with a positive slope when a log scale is used to plot the rate of hot electron injection. If transistors 12 and 14 are biased in region 44, then the transistor with the lower threshold voltage will exhibit a higher rate of hot electron injection. As a result, the threshold voltage of this transistor will increase at a faster rate until the conductivity of the two transistors are substantially the same. Transistors 12 and 14 can be biased in region 44 by using enhancement mode devices with a positive threshold voltage that is a fraction of the power supply voltage. The degree of balance can be determined by connecting data lines 32 and 34 to a differential sense amplifier (not shown) and monitoring the small voltage drop across transistors 38 and 40. The balance operation can be terminated when the conductivity of transistors 12 and 14 reach an acceptable balance level.

Figure 5:
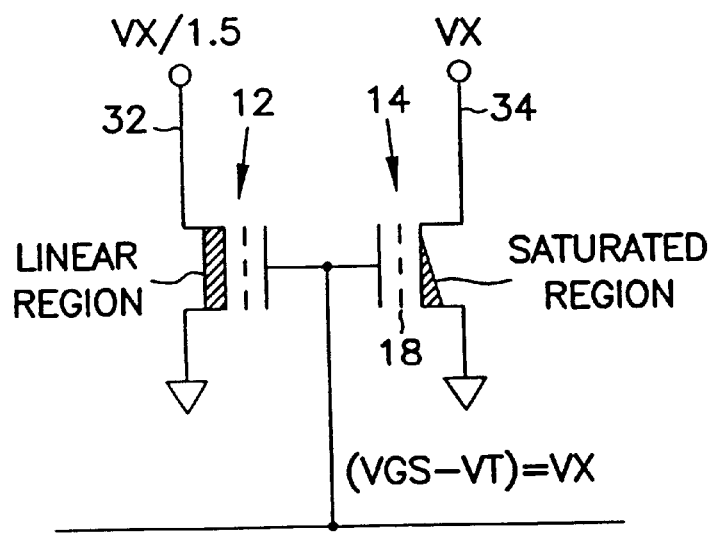
FIG. 5 is a schematic diagram that illustrates aspects of the operation of the flash memory cell of FIG. 1.

Once transistors 12 and 14 are balanced, cell 10 can be programmed by storing charge on floating gate 18 of transistor 14. This operation is depicted graphically in FIG. 5. A voltage, labeled $V_X$ is applied to data line 34 and a lower voltage, $1.5/V_X$ is applied to data line 32. This induces hot electron injection in transistor 14. Meanwhile, transistor 12 exhibits insubstantial hot electron injection because the gate voltage is higher than the drain voltage such that transistor 12 operates in the linear region. Thus, the device characteristics of transistor 12 are substantially unchanged while charge is built up on floating gate 18 of transistor 14 which reduces its conductive state. The change in conductivity of transistor 14 can be monitored during programming to store a value that represents a number of bits of data.

As described below, cell 10 uses a floating gate that induces step changes in drain current as charge builds up on floating gate 18. The step changes in drain current of transistor 14 are monitored (e.g., counted) during programming. The number of step changes in drain current can be converted to a binary representation, e.g., a number of bits. For example, the binary number 1001 can be programmed into cell 10 by storing enough charge on floating gate 18 so as to induce nine step changes in drain current of transistor 14.

It is noted that the programming step can include the step of storing no additional charge on floating gate 18 such that the difference in charge between floating gates 16 and 18 is substantially zero.

In a read operation, data is read from cell 10 by amplifying the difference in charge stored on floating gates 16 and 18. For example, load circuit 46 of FIG. 2B is coupled to data lines 32 and 34 to detect and amplify any imbalance in charge on floating gates 16 and 18. Load circuit 46 includes first and second p-channel field effect transistors coupled in a differential configuration. Namely, a gate of transistor 48 is coupled to a gate of transistor 50. A source of transistor 48 and a source of transistor 50 are coupled to a power supply, $V_{DD}$. A drain of transistor 48 is coupled to the gate of transistor 48 and to data line 32. Finally, a drain of transistor 50 is coupled to data line 34. The differential configuration of load circuit 46 amplifies the differences in drain current of transistors 12 and 14 due to differences in charge stored on floating gates 16 and 18. Since load circuit 46 can have a large gain and very low offsets, small differences in charge can be detected, including as low as the charge of a single electron. Thus a large number of distinct charge states can be programmed with cell 10 that correspond to step changes in drain current induced by storing charge on floating gate 18 of cell 10. By counting the number of steps in the difference in drain current between transistors 12 and 14, a differential signal is created that corresponds to the value of the data stored in cell 10. This signal may be converted into a binary number based on the number of step changes in drain current.

Floating gates 16 and 18 are configured to allow detection of step changes in drain current when charge is stored. For example, floating gates 16 and 18 can be fabricated as a layer of polysilicon material disposed in a gate oxide using 0.3 micron technology and a 100 Å gate oxide thickness. With this configuration, floating gates 16 and 18 have a capacitance on the order of 0.3 fF. A single electron changes the potential of such a floating gate by approximately 0.5 mV. Since load circuit 46 has a gain of at least 10, a single electron difference between floating gates 16 and 18 results in an output of approximately 5 mV from load circuit 46 based on the modified drain current of transistor 18. This voltage level is detectable with conventional circuitry. Thus, the effect of a single electron difference in stored charge is measurable and a value that represents multiple bits of data can be stored in cell 10 by counting the number of measurable steps of change in the drain current of transistor 14 as compared to the drain current of transistor 12.

In an alternative embodiment, floating gates 16 and 18 can use a nano-crystalline configuration. FIG. 3 is a cross sectional diagram of a transistor memory cell 10. The transistor of FIG. 3 is described herein with respect to transistor 14 of cell 10. However, it is understood that transistor 12 can be constructed in a similar manner. Floating gate 18 comprises crystals of, for example, silicon, silicon carbide, or other appropriate semiconductor material that are implanted in oxide layer 52 at low density using conventional processing techniques. Due to the low density of implantation, the semiconductor material nucleates into grains to form crystals 54. Crystals 54 are referred to as "nano-grains" or "nano-crystals" due to their typical size with a surface area on the order of $10^{-13}$ cm$^2$.

Crystals 54 of floating gate 18 are formed at a distance of approximately 60 to 100 Å from working surface 56 of semiconductor layer 58. Advantageously, this distance, coupled with the size of crystals 54, allows each crystal 54 to trap at most one electron which causes a step change in the drain current of transistor 14. This step change in drain current is measurable and thus allows storage of multiple data bits within a single transistor 14.

The step change in current of transistor 14 can be seen from the following analysis. First, the capacitance between crystal 54 and semiconductor layer 56 is given according to the following equation:

$$C = \frac{\epsilon_r \epsilon_o \times \text{Area}}{d} + \text{correction for fringing}$$

in which C is the capacitance, Area is the surface area of crystal 54, d is the distance between crystal 54 and surface 56 of semiconductor layer 58, and the correction term accounts for the fact that crystal 54 has a smaller surface area than semiconductor layer 56 and the electric field will vary at the perimeter of crystals 54. Assuming that d is 100 angstroms and the area of crystal 54 is on the order of $10^{-13}$ cm$^2$, the capacitance of crystal 54 is approximately $1.0 \times 10^{-19}$ Farad. The charge of an electron is $1.6 \times 10^{-19}$ coulombs and will result in a change of potential of crystal 54 by approximately 1.6 volts. Crystal 54 becomes repulsive to electrons once a single electron is trapped during a write operation. Thus, each crystal 54 is constrained to a distinct change in charge state by capturing only one electron. The change in charge state in turn causes a distinct step change in drain current of transistor 14. Transistor 14 amplifies the change in drain current and thus the change is easily detectable.

Floating gate 18 of memory cell 10 can be programmed to store the value of a number of bits at the same time. To do this, the number of step changes in drain current during a write operation are counted. The number of step changes in drain current relates to the value of the bits to be stored. In this manner, a multiplicity of different states can be stored resulting in the storage of multiple bits on a single floating gate 18.

It is noted that a programmed cell is erased by driving the voltage on word line 36 to a large negative voltage such that charge on floating gate 18 is discharged using conventional tunneling techniques.

Figure 6:
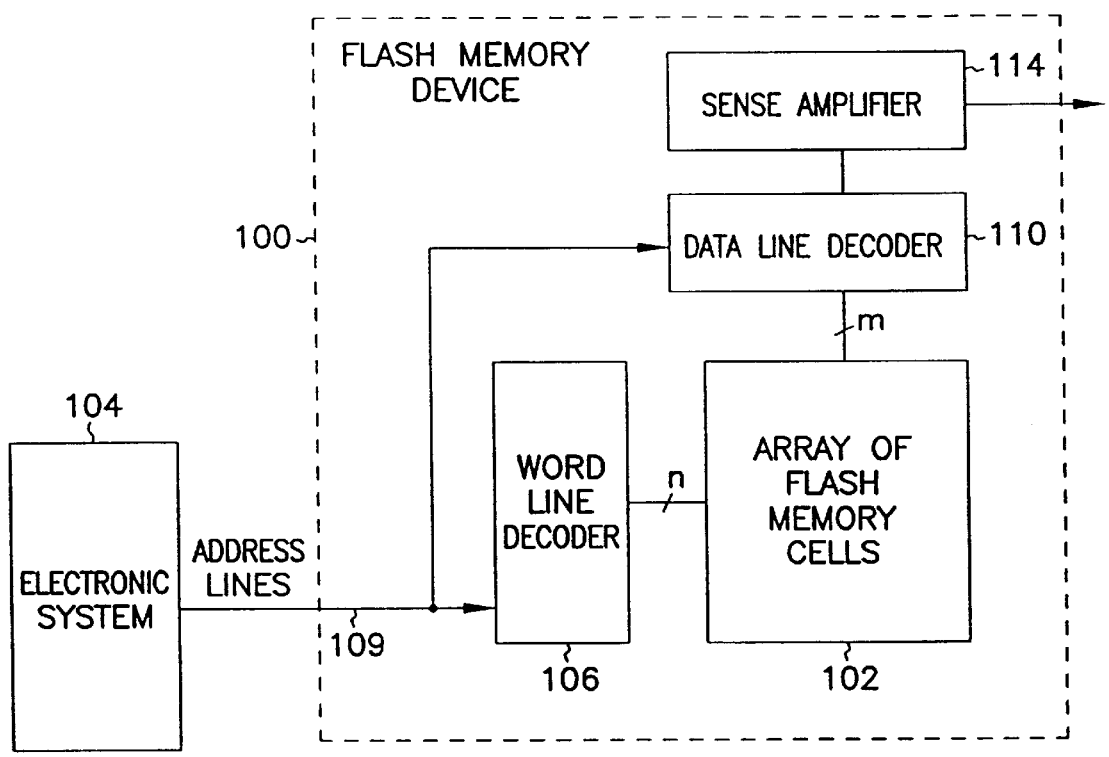
FIG. 6 is a block diagram of a flash memory device according to the teachings of the present invention.

FIG. 6 is a block diagram of an embodiment of a memory device, indicated generally at 100, that is constructed according to the teachings of the present invention.

Memory device 100 includes array 102 of flash memory cells. Array 102 stores data using a number of memory cells of the type shown and described above with respect to FIGS. 1 through 5.

Each cell of array 102 may be accessed according to address signals provided by electronic system 104. Address lines 109 are coupled to word line decoder 106 and data line decoder 110. Word line decoder 106 and data line decoder 110 are coupled to array 102. Sense circuit 114 is coupled to data line decoder 110 and provides the output of flash memory device 100.

In operation, flash memory device 100 writes, reads and erases multiple bits in each storage location of the array 102.

In write mode, flash memory device 100 receives an address on address line 109. Word line decoder 106 decodes the associated word line for a selected cell and activates the word line. Data line decoder 110 similarly decodes the data line for the desired cell. The selected cell in array 102 is then programmed to a selected state to store a number of bits in the cell as described above.

In read mode, the address of the selected cell is similarly decoded and the cell of array 102 is accessed. Data line decoder 110 couples the selected cell to sense circuit 114 which outputs a signal with a number of bits based on the sensed difference in drain currents of the two transistors in the accessed cell.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the data line decoders are not necessary when a sense amplifier is provided for each data line. Further, crystals 30 can be formed from other materials that are capable of trapping an electron by hot electron injection. Other configurations for the floating gate can also be used so long as measurable step in drain current can be measured as charge is stored on the floating gates.

What is claimed is:

1. A flash memory cell, comprising:
   a first transistor with a first floating gate;
   a second transistor with a second floating gate;
   a load circuit coupleable to first and second data lines to balance the state of the first and second transistors prior to programming the flash memory cell; and
   wherein the first and second transistors are coupled to the first data line and the second data line respectively and a common word line such that the flash memory cell provides a differential output signal on the data lines based on charge stored on the first and second floating gates, the differential output signal representing multiple bits of data stored in the flash memory cell.

2. The flash memory cell of claim 1, wherein the first and second floating gates comprise crystals of silicon disposed in gate oxides of the first and second transistors.

3. The flash memory cell of claim 1, wherein the first and second floating gates comprise layers of conductive material formed in gate oxides of the first and second transistors such that measurable step changes in drain current are created in the transistors as charge is deposited on the floating gates.

4. The flash memory cell of claim 1, wherein the first transistor and the second transistor comprise field effect transistors.

5. The flash memory cell of claim 1, wherein the load circuit comprises a first and a second resistor coupled to a power supply, wherein the first resistor is coupled between the power supply and the first data line and the second resistor is coupled between the second data line and the power supply.

6. The flash memory cell of claim 1, wherein the load circuit comprises a first and a second transistor coupled to a power supply, wherein the first transistor is coupled between the power supply and the first data line and the second transistor is coupled between the second data line and the power supply.

7. The flash memory cell of claim 6, wherein the first and second transistors comprise first and second p-channel field effect transistors coupled in a differential configuration, wherein a drain of the first transistor is coupled to a gate of the first transistor and the first data line and a drain of the second transistor is coupled to the second data line.

8. A flash memory cell, comprising:
   a first transistor with a first floating gate, wherein the first transistor is coupled to a first data line;
   a second transistor with a second floating gate, wherein the second transistor is coupled to a second data line;
   a load circuit that is coupleable to the first and second data lines to balance the state of the reference and storage transistors prior to programming the flash memory cell; and
   wherein the first transistor stores a state of the second transistor prior to programming of the flash memory cell such that a difference between the state of the first transistor and the state of the second transistor, after programming, represents the value of the data stored in the flash memory cell.

9. The flash memory cell of claim 8, wherein each floating gate comprises a number of crystals of silicon.

10. The flash memory cell of claim 8, wherein the first and second floating gates comprise layers of conductive material formed in gate oxides of the first and second transistors such that measurable step changes in drain current are created in the transistors as charge is deposited on the floating gates.

11. The flash memory cell of claim 8, wherein the first transistor and the second transistor comprise field effect transistors.

12. The flash memory cell of claim 8, wherein the load circuit comprises a first and a second resistor coupled to a power supply, wherein the first resistor is coupled between the power supply and the first data line and the second resistor is coupled between the second data line and the power supply.

13. The flash memory cell of claim 8, wherein the load circuit comprises a first and a second transistor coupled to a power supply, wherein the first transistor is coupled between the power supply and the first data line and the second transistor is coupled between the second data line and the power supply.

14. The flash memory cell of claim 13, wherein the first and second transistors comprise first and second p-channel field effect transistors coupled in a differential configuration, wherein a in of the first transistor is coupled to a gate of the first transistor and the first data line and a drain of the second transistor is coupled to the second data line.

15. A memory device, comprising:
   an array of flash memory cells, each memory cell comprising first and second floating gate transistors;
   a word line decoder coupled to the array of flash memory cells;
   a data line decoder coupled to the array of flash memory cells;
   a plurality of address lines coupled to the data line decoder and the word line decoder, wherein the data line decoder and the word line decoder receive address signal for accessing each cell of the array from an electronic device; and a sense amplifier coupled to the data line decoder to receive signals from the first and second floating gate transistors of an accessed memory cell so as to determine multiple bits of data stored in the memory cell based on the difference in drain current of the first and second transistors.

16. The memory device of claim 15, wherein the first and second floating gate transistors comprise nano-crystalline floating gates.

17. The memory device of claim 15, wherein the floating gate comprises a layer of polysilicon material.

18. The flash memory cell of claim 15, wherein the first and second floating gate transistors comprise field effect transistors.

19. The memory device of claim 15, and further comprising a balancing circuit that balances the conductive state of the first and second floating gate transistors of a memory cell prior to storing data in the cell.

20. The flash memory cell of claim 15, wherein the first and second floating gates comprise layers of conductive material formed in gate oxides of the first and second transistors such that measurable step changes in drain current are created in the transistors as charge is deposited on the floating gates.

21. A method of storing data in a flash memory cell having first and second floating gate transistors, the method comprising:
    balancing the drain current of the first and second floating gate transistors by adjusting the charge on the floating gates;
    changing the conductive state of the first transistor;
    measuring the change in drain current of the first transistor;
    ceasing to change the conductive state of the first transistor when the drain current achieves a selected level associated with the value of the data to be stored; and
    storing charge on the floating gate of the second transistor.

22. The method of claim 21, wherein changing the conductive state of the first transistor comprises trapping electrons with nano-crystals of the floating gate of the first transistor.

23. The method of claim 21, wherein measuring the change in drain current comprises counting step changes in drain current.

24. The method of claim 21, wherein storing charge on the floating gate of the second transistor comprises storing the initial state of the second transistor on the first transistor.

25. The method of claim 21, wherein balancing the drain current of the first and second floating gate transistors comprises applying a load to first and second data lines of the flash memory cell so as to change the conductive state of one of the first and second transistors by hot electron injection.

26. The method of claim 21, wherein changing the conductive state of the first transistor comprises storing charge on the floating gate of the first transistor.

27. The method of claim 21, wherein storing charge on the floating gate of the first transistor comprises:
    applying a first voltage to the data line of the first transistor; and
    applying a second voltage, less than said first voltage, to the data line of the second transistor.

28. A method of programming a flash memory cell having first and second floating gate transistors, the method comprising:
    balancing the flash memory cell such that the first and second floating gate transistors have substantially the same conductive state; and
    depositing charge on the floating gates of the first and second floating gate transistors so as to create measurable step changes in drain current corresponding to the value of the multiple bits of data to be stored in the flash memory cell.

29. The method of claim 28, wherein balancing the flash memory cell comprises applying a load to first and second data lines of the flash memory cell so as to change the conductive state of one of the first and second transistors by hot electron injection.

30. The method of claim 28, wherein depositing charge on the floating gates of the first and second floating gate transistors comprises:
    applying a first voltage to the data line of the first transistor; and
    applying a second voltage, less than the first voltage, to the data line of the second transistor.

31. A method of reading data from a flash memory cell having first and second floating gate transistors, the method comprising:
    balancing the conductive state of the first and second floating gate transistors;
    programming a flash memory cell with a plurality of distinct charge states that correspond to step changes in drain current induced by storing charge on the floating gate of the second floating gate transistor;
    detecting the difference in charge on the floating gates of the first and second floating gate transistors;
    amplifying the differences in drain current of the first and second floating gate transistors due to the differences in charge stored on the floating gates of the first and second floating gate transistors; and
    creating a differential signal corresponding to the value of the data stored in the flash memory cell.

32. The method of claim 31, wherein creating a differential signal comprises counting the number of steps in the difference in drain current between the first and second floating gate transistors.

33. The method of claim 32, and further comprising converting the differential signal into a binary number based on the number of step changes in drain current.

34. The method of claim 32, wherein balancing the flash memory cell comprises applying a load to first and second data lines of the flash memory cell so as to change the conductive state of one of the first and second transistors by hot electron injection.

35. A method of writing data to a flash memory cell of a flash memory device, the method comprising:
    receiving an address on an address line;
    decoding an associated word line for a selected flash memory cell, wherein the flash memory cell comprises a reference transistor with a first floating gate and a storage transistor with a second floating gate;
    activating the word line;
    decoding an associated data line for the selected flash memory cell; and
    programming the selected flash memory cell to store multiple bits of data bits in the memory cell based on the difference in drain current of the reference and storage transistors.

* * * * *